United States Patent
Kim et al.

(10) Patent No.: US 12,153,095 B2
(45) Date of Patent: *Nov. 26, 2024

(54) DIAGNOSING BATTERIES BASED ON VOLTAGE DEVIATION VARIATIONS

(71) Applicant: LG Energy Solution, Ltd., Seoul (KR)

(72) Inventors: Ki-Hoon Kim, Daejeon (KR); Han-Gon Park, Daejeon (KR); Chang-Yong Song, Daejeon (KR); Bo-Kyun Lee, Daejeon (KR); Ji-Yong Kim, Daejeon (KR); Cheol-Taek Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,937

(22) Filed: Feb. 20, 2024

(65) Prior Publication Data
US 2024/0192280 A1 Jun. 13, 2024

Related U.S. Application Data

(63) Continuation of application No. 18/535,541, filed on Dec. 11, 2023.

(30) Foreign Application Priority Data

Dec. 12, 2022 (KR) .................. 10-2022-0172880

(51) Int. Cl.
| | |
|---|---|
| H01M 10/44 | (2006.01) |
| B60L 3/00 | (2019.01) |
| G01R 31/3835 | (2019.01) |
| G01R 31/52 | (2020.01) |
| H01M 10/46 | (2006.01) |
| G07C 5/08 | (2006.01) |

(52) U.S. Cl.
CPC ........ *G01R 31/3835* (2019.01); *B60L 3/0046* (2013.01); *G01R 31/52* (2020.01); *G07C 5/0808* (2013.01)

(58) Field of Classification Search
CPC ... G01R 31/3835; G01R 31/52; B60L 3/0046; G07C 5/0808; H02J 7/0048; H02J 7/0047; H02J 7/0044

USPC ........ 320/107, 112, 132, 149; 324/531, 433, 324/434

See application file for complete search history.

(56) References Cited

U.S. PATENT DOCUMENTS

| | | | |
|---|---|---|---|
| 2016/0054389 A1 | 2/2016 | Koba et al. | |
| 2019/0105942 A1* | 4/2019 | Webber | B60B 7/0013 |
| 2021/0257681 A1 | 8/2021 | Takahashi et al. | |
| 2022/0317197 A1 | 10/2022 | Kim et al. | |
| 2023/0296688 A1 | 9/2023 | Kim et al. | |

FOREIGN PATENT DOCUMENTS

| | | |
|---|---|---|
| JP | 2010231948 A | 10/2010 |
| JP | 5744956 B2 | 7/2015 |
| JP | 2017211273 A | 11/2017 |
| KR | 101632831 B1 | 6/2016 |
| KR | 102194845 B1 | 12/2020 |
| KR | 20210048810 A | 5/2021 |
| KR | 20210059566 A | 5/2021 |
| KR | 20210079261 A | 6/2021 |
| KR | 20220036701 A | 3/2022 |
| KR | 20220139755 A | 10/2022 |
| KR | 20220146255 A | 11/2022 |
| WO | 2019243950 A1 | 12/2019 |

OTHER PUBLICATIONS

International Search Report for Application No. PCT/KR2023/020457 mailed Mar. 18, 2024, pp. 1-3.

* cited by examiner

*Primary Examiner* — Edward Tso
(74) *Attorney, Agent, or Firm* — Lerner David LLP

(57) ABSTRACT

Aspects of the disclosed technology include techniques, a mechanism, and an apparatus for diagnosing a battery. One or more processors may measure voltages of a plurality of batteries and, based on the measured voltages, determine a voltage deviation of the plurality of batteries. The one or more processors may determine a voltage deviation variation of each battery of the plurality of batteries at predetermined times periods and may compare a pattern of the voltage deviation variations of each battery of the plurality of batteries with a preset diagnosis pattern to diagnose a state of each of the plurality of batteries.

20 Claims, 14 Drawing Sheets

FIG. 2

|  | FIRST BATTERY(Ba) | SECOND BATTERY(Bb) | THIRD BATTERY(Bc) | FOURTH BATTERY(Bd) |
|---|---|---|---|---|
| VOLTAGE[mV] | Va | Vb | Vc | Vd |
| AVERAGE VOLTAGE[mV] | Vavg | | | |
| VOLTAGE DEVIATION[mV] | dVa | dVb | dVc | dVd |

FIG. 3

|  | t0 | t1 | t2 | t3 |
|---|---|---|---|---|
| VOLTAGE DEVIATION[mV] | dV0 | dV1 | dV2 | dV3 |
| VOLTAGE DEVIATION VARIATION[mV] | - | △dV1 | △dV2 | △dV3 |

DIAGNOSING BATTERIES BASED ON VOLTAGE DEVIATION VARIATIONS

CROSS-REFERENCE TO RELATED APPLICATION

The present application is a continuation of U.S. patent application Ser. No. 18/535,541 filed Dec. 11, 2023, which claims the benefit under 35 U.S.C. § 119(a) of a Korean patent application filed on Dec. 12, 2022, in the Korean Intellectual Property Office and assigned Application Number 10-2022-0172880, the entire disclosure of which is hereby incorporated by reference.

TECHNICAL FIELD

The present disclosure relates to systems and methods for diagnosing a battery by detecting an internal micro short circuit of the battery.

BACKGROUND

Recently, the demand for portable electronic products such as notebook computers, video cameras, and portable telephones has increased sharply, and electric vehicles, energy storage batteries, robots, satellites, and the like have been developed in earnest. Accordingly, high-performance batteries allowing repeated charging and discharging are actively being studied.

Commercially available batteries include nickel-cadmium, nickel-hydrogen, nickel-zinc, and lithium batteries. Lithium batteries are in the limelight since they have almost no memory effect compared to nickel-based batteries and have a low self-charging rate and high energy density. Memory effect is a loss of energy capacity in a rechargeable battery resulting from charging the battery when it is partially discharged.

An energy storage system using commercial batteries may be a device that stores large-scale power and provides the stored power to a plurality of load facilities. Energy storage systems may be used in industrial, building, or household energy management systems. Such energy management systems may be used as a regular power grid and/or an emergency power grid by providing the stored power to load facilities at each point of use.

When a micro short circuit occurs inside a battery, current leakage may occur. When the battery is part of a battery pack, current leakage may result in the voltage of the battery gradually becoming lower than that of other batteries in the battery pack. If the micro short circuit continues, a hard short circuit may occur, possibly causing permanent damage to the battery pack. A hard short (or dead short) may occur when the voltage difference between a plurality of batteries in the battery pack continues to increase. The hard short (or dead short) may cause a surge of current within the battery pack, which may lead to sparks, overheating, circuit damage, or the like.

For example, if the voltage difference between the plurality of batteries continue to increase, then an inrush current (or overcurrent) may flow inside of the battery pack. Inrush currents may generate heat and, consequently, may cause the hard short. Further, inrush currents may cause permanent damage to the circuitry within the battery pack.

Therefore, it is necessary to develop a technology capable of diagnosing whether a micro short circuit has occurred inside the battery before permanent damage occurs.

SUMMARY

The present disclosure is directed to systems and methods for diagnosing a battery based on determining whether an internal micro short circuit occurred in the battery.

These and other objects and advantages of the present disclosure may be understood from the following detailed description and will become fully apparent from the embodiments of the present disclosure. Also, it will be easily understood that the objects and advantages of the present disclosure may be realized by the means shown in the appended claims and combinations thereof.

An apparatus for diagnosing a battery according to one aspect of the present disclosure may comprise a voltage measuring unit configured to measure voltages of a plurality of batteries; and a control unit configured to calculate a voltage deviation of the plurality of batteries, calculate a voltage deviation variation of each of the plurality of batteries at predetermined time periods, and compare a pattern of the voltage deviation variations of each battery of the plurality of batteries with a preset diagnosis pattern to diagnose a state of each battery of the plurality of batteries.

The control unit may be configured to diagnose a state of a corresponding battery based on at least one of a sum, a magnitude, or an increase pattern of a plurality of voltage deviation variations calculated at a plurality of times for each battery of the plurality of batteries.

The preset diagnosis patterns may include a first diagnosis pattern corresponding to the sum of the plurality of voltage deviation variations, a second diagnosis pattern corresponding to the magnitude of each of the plurality of voltage deviation variations, a third diagnosis pattern corresponding to the maximum magnitude of the plurality of voltage deviation variations, and a fourth diagnosis pattern corresponding to the increase pattern of the plurality of voltage deviation variations. Based on determining that a micro short circuit has occurred using at least one diagnosis pattern, the battery may be disconnected or marked for replacement.

The control unit may determine that an internal micro short circuit occurred in the battery when the pattern of the plurality of voltage deviation variations corresponds to any one of the diagnosis patterns.

When the plurality of voltage deviation variations are positive numbers and the sum of the plurality of voltage deviation variations is greater than or equal to a first preset criterion value, the control unit may determine that the pattern of the voltage deviation variations corresponds to the first diagnosis pattern. The control unit may diagnose that an internal micro short circuit occurred in the battery.

When the plurality of voltage deviation variations are greater than or equal to a second preset criterion value, the control unit may determine that the pattern of the voltage deviation variations corresponds to the second diagnosis pattern. The control unit may diagnose that an internal micro short circuit occurred in the battery.

When the plurality of voltage deviation variations are positive numbers and at least one voltage deviation variation of the plurality of voltage deviation variations is greater than or equal to a third preset criterion value, the control unit may determine that the pattern of the voltage deviation variations corresponds to the third diagnosis pattern. The control unit may diagnose that an internal micro short circuit occurred in the battery.

The third preset criterion value may be less than the first preset criterion value that corresponds to the first diagnosis pattern and may be greater than the second preset criterion value that corresponds to the second diagnosis pattern.

When the plurality of voltage deviation variations are positive numbers and the plurality of voltage deviation variations increase over time, the control unit may determine that the pattern of the voltage deviation variations corresponds to the fourth diagnosis pattern. The control unit may diagnose that an internal micro short circuit occurred in the battery.

When the plurality of voltage deviation variations are positive numbers, the control unit may be configured to compare the pattern of the voltage deviation variations of the corresponding battery to a preset diagnosis pattern.

The control unit may be configured to calculate an average voltage of the plurality of batteries and calculate a voltage deviation of each battery of the plurality of batteries by calculating a difference between the calculated average voltage and the voltage of each battery of the plurality of batteries.

According to another aspect of the present disclosure, a battery pack may comprise the apparatus for diagnosing a battery.

According to some embodiments, a vehicle may comprise the apparatus for diagnosing a battery.

According to some embodiments, a method for diagnosing a battery may comprise measuring voltages of a plurality of batteries; calculating a voltage deviation of the plurality of batteries; calculating a voltage deviation variation of each battery of the plurality of batteries at predetermined time periods; and comparing a pattern of voltage deviation variations of each battery of the plurality of batteries with a preset diagnosis pattern to diagnose a state of each battery of the plurality of batteries.

According to some embodiments, the apparatus for diagnosing a battery may diagnose the state of each battery by tracking a trend in a voltage deviation variation of the battery at predetermined time periods.

The effects of the present disclosure are not limited to the effects mentioned above, and other effects not mentioned will be clearly understood by those skilled in the art from the description of the claims.

One aspect of the disclosure provides for an apparatus for diagnosing a battery, comprising: one or more processors configured to: measure voltages of a plurality of batteries; calculate a voltage deviation of the plurality of batteries; calculate a voltage deviation variation of each battery of the plurality of batteries at predetermined time periods; compare a pattern of the voltage deviation variation of each battery of the plurality of batteries with a preset diagnosis pattern to diagnose a state of each battery of the plurality of batteries; and output one or more signals to an external device wherein each signal indicates a battery diagnosis for each battery of the plurality of batteries.

According to some examples, the one or more processors are further configured to diagnose a state of a corresponding battery based on at least one of a sum, a magnitude, or an increase pattern of a plurality of voltage deviation variations calculated at a plurality of times for each battery of the plurality of batteries.

According to some examples, when the plurality of voltage deviation variations are positive numbers, the one or more processors are configured to compare the pattern of the voltage deviation variation of the corresponding battery with a preset diagnosis pattern.

According to some examples, the preset diagnosis pattern corresponds to at least one of: a first diagnosis pattern corresponding to the sum of the plurality of voltage deviation variations; a second diagnosis pattern corresponding to the magnitude of each of the plurality of voltage deviation variations; a third diagnosis pattern corresponding to a maximum magnitude of the plurality of voltage deviation variations; or a fourth diagnosis pattern corresponding to the increase pattern of the plurality of voltage deviation variations.

According to some examples, the one or more processors are configured to diagnose that an internal micro short circuit has occurred in the battery when the pattern of the plurality of voltage deviation variations corresponds to at least one of the diagnosis patterns.

According to some examples, the first diagnosis pattern comprises the one or more processors determining that when the plurality of voltage deviation variations are positive numbers and the sum of the plurality of voltage deviation variations is greater than or equal to a first preset criterion value, an internal micro short circuit has occurred in the battery.

According to some examples, the second diagnosis pattern comprises the one or more processors determining that when the plurality of voltage deviation variations are greater than or equal to a second preset criterion value, an internal micro short circuit has occurred in the battery.

According to some examples, the third diagnosis pattern comprises the one or more processors determining that when the plurality of voltage deviation variations are positive numbers and at least one of the plurality of voltage deviation variations is greater than or equal to a third preset criterion value, an internal micro short circuit has occurred in the battery.

According to some examples, the third preset criterion value is configured to be less than a first preset criterion value that corresponds to the first diagnosis pattern and to be greater than a second preset criterion value that corresponds to the second diagnosis pattern.

According to some examples, the fourth diagnosis pattern comprises the one or more processors determining that when the plurality of voltage deviation variations are positive numbers and the plurality of voltage deviation variations increase over time, an internal micro short circuit has occurred in the battery.

According to some examples, the one or more processors are configured to calculate an average voltage of the plurality of batteries and calculate a voltage deviation of each battery of the plurality of batteries by calculating a difference between the calculated average voltage and the voltage of each of the plurality of batteries.

According to some examples, the external device corresponds to one of an onboard vehicle system, an external vehicle system, one or more servers configured to communicate with a vehicle, or a mobile device configured to communicate with the vehicle.

A different aspect of the disclosure provides for a battery pack comprising the apparatus for diagnosing a battery.

A different aspect of the disclosure provides for a vehicle comprising the apparatus for diagnosing a battery.

A different aspect of the disclosure provides for a method for diagnosing a battery, comprising: receiving measured voltages of a plurality of batteries; for each battery of the plurality of batteries: determining, based on the received measure voltages, a voltage deviation at predetermined time periods; determining, based on the determined voltage deviation, a voltage deviation variation at the predetermined periods; diagnosing a state of the respective battery by comparing a pattern of the voltage deviation variations of each of the plurality of batteries to a preset diagnosis pattern;

and outputting one or more signals to an external device wherein each signal indicates a battery diagnosis for each battery of the plurality of batteries.

According to some examples, the preset diagnosis pattern corresponds to at least one of: a first diagnosis pattern corresponding to a sum of a plurality of voltage deviation variations; a second diagnosis pattern corresponding to a magnitude of each of the plurality of voltage deviation variations; a third diagnosis pattern corresponding to a maximum magnitude of the plurality of voltage deviation variations; or a fourth diagnosis pattern corresponding to an increase pattern of the plurality of voltage deviation variations.

According to some examples, determining that an internal micro short circuit occurred in the battery based on satisfying the first diagnosis pattern comprises determining that the plurality of voltage deviation variations are positive numbers and the sum of the plurality of voltage deviation variations is greater than or equal to a first preset criterion value.

According to some examples, determining that an internal micro short circuit occurred in the battery based on satisfying the second diagnosis pattern comprises determining that the plurality of voltage deviation variations are greater than or equal to a second preset criterion value.

According to some examples, determining that an internal micro short circuit occurred in the battery based on satisfying the third diagnosis pattern comprises determining that the plurality of voltage deviation variations are positive numbers and at least one of the plurality of voltage deviation variations is greater than or equal to a third preset criterion value.

According to some examples, determining that an internal micro short circuit occurred in the battery based on satisfying the fourth diagnosis pattern comprises determining that the plurality of voltage deviation variations are positive numbers and the plurality of voltage deviation variations increase over time.

BRIEF DESCRIPTION OF THE DRAWINGS

FIG. 2 illustrates example voltages for a plurality of battery cells, in accordance with aspects of the disclosure.

FIG. 3 illustrates an example voltage deviation variation, in accordance with aspects of the disclosure.

DETAILED DESCRIPTION

Figure 1:
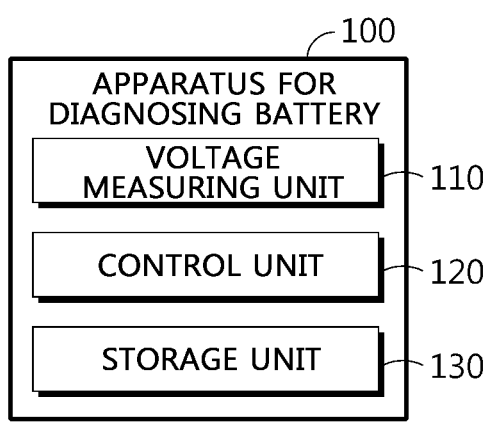
FIG. 1 illustrates an example apparatus for diagnosing a battery, in accordance with aspects of the disclosure.

The embodiments discussed herein are for illustration purposes only and are not intended to limit the scope of the disclosure. It should be understood that other equivalents and modifications may be made without departing from the scope of the disclosure.

It should be appreciated that embodiments of the present disclosure and the terms used herein are not intended to limit the technological features set forth herein to particular embodiments and may include various changes, equivalents, or replacements for a corresponding embodiment. With regard to the description of the drawings, similar reference numerals may be used to refer to similar or related elements. It is to be understood that a singular form of a noun corresponding to an item may include one or more of the items, unless the relevant context clearly indicates otherwise.

It should be understood that phrases such as "A or B", "at least one of A and B", "at least one of A or B", "A, B or C", "at least one of A, B and C", and "at least one of A, B, or C" may include any one of items listed together in the corresponding phrase among those phrases, or all possible combinations of the items. Terms such as "first", "second", "firstly", "secondly", "A", "B", "(a)" or "(b)" may simply be used to distinguish a corresponding component from other corresponding components, and unless specifically stated to the contrary, do not limit the corresponding components in other respects (e.g., importance or order).

It should be understood that if a certain (e.g., first) element is referred to as being "linked", "combined", "accessed", or "connected" or "coupled" with or without the terms "functionally" or "communicatively" to another (e.g., second) component, it means that the certain component can be connected to the other component directly (e.g., in a wired manner), wirelessly, or through a third component. When a portion is referred to as being "connected" to another portion, it is not limited to the case that they are "directly connected", but it also includes the case where they are "indirectly connected" with another element being interposed between them. When a portion is referred to as "comprising" or "including" any element, it means that the portion may include other elements without excluding elements, unless specifically stated otherwise.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store, or between two user devices directly. If distributed online, at least part of the computer program product may be temporarily generated or at least temporarily stored in the machine-readable storage medium, such as memory of the manufacturer's server, a server of the application store, or a relay server.

Hereinafter, embodiments of the present disclosure will be described in detail with reference to the accompanying drawings.

FIG. 1 is a diagram schematically illustrating an apparatus 100 for diagnosing a battery, according to an embodiment of the present disclosure. The term apparatus and system may be used interchangeably herein. Although not shown, apparatus 100 may include an interface circuit for interacting with other components of a device, such as a vehicle. According to some embodiments, the communication scheme of the interface circuit may be a device-to-device communication scheme such as a bus, general purpose input and output (GPIO), serial peripheral interface (SPI), or mobile industry processor interface (MIPI).

As further illustrated in FIG. 1, apparatus 100 may include voltage measuring unit 110, control unit 120, and storage unit 130.

Control unit 120 included in apparatus 100 for diagnosing a battery may optionally include processors, application-specific integrated circuits (ASICs), other chipsets, logic circuits, registers, communication modems, and data processing devices to execute various control logics performed in the present disclosure. Control unit 120 may be implemented as a general-purpose microprocessor or array of multiple logic gates for processing various operations, such as a microprocessor, a central processing unit (CPU), a graphic processor unit (GPU), an application processor (AP), application specific integrated process, or combinations thereof.

When the control logic is implemented as software, control unit 120 may be implemented as a set of program modules. At this time, the program module may be stored in the memory and executed by control unit 120. The memory may be inside or outside control unit 120 and may be connected to control unit 120 by various well-known means. The memory may store various data, instructions, mobile applications, computer programs, and the like. For example, the memory may be implemented as non-volatile memory such as ROM, PROM, EPROM, EEPROM, flash memory, PRAM, MRAM, RRAM, FRAM, etc., or volatile memory such as DRAM, SRAM, SDRAM, PRAM, RRAM, FeRAM, etc. or may be implemented in the form of HDD, SSD, SD, Micro-SD, etc., or a combination thereof.

In addition, apparatus 100 for diagnosing a battery may further include a storage unit 130. The storage unit 130 may store data necessary for the operation and function of each component of apparatus 100 for diagnosing a battery, data generated in the process of performing the operation or function, or the like. Storage unit 130 is not particularly limited in its kind as long as it is a known information storage means that can record, erase, update and read data. As an example, the information storage means may include non-volatile memory such as ROM, PROM, EPROM, EEPROM, flash memory, PRAM, MRAM, RRAM, FRAM, etc., or volatile memory such as DRAM, SRAM, SDRAM, PRAM, RRAM, FeRAM, etc. or may be implemented in the form of HDD, SSD, SD, Micro-SD, etc., or a combination thereof. In addition, storage unit 130 may store program codes in which processes executable by control unit 120 are defined.

For example, storage unit 130 may be communicatively connected to control unit 120. Storage unit 130 may store voltage information of a plurality of batteries measured by voltage measuring unit 110. In addition, storage unit 130 may store voltage deviations and voltage deviation variations of a plurality of batteries calculated by control unit 120 at each predetermined time period.

As used herein, battery means one physically separable independent cell having a negative electrode terminal and a positive electrode terminal. For example, a lithium-ion battery or a lithium polymer battery may be regarded as a battery. Hereinafter, for convenience of description, a battery will be described as meaning one independent cell. A battery pack is a collection of two or more batteries.

Voltage measuring unit 110 may be configured to measure the voltage of each battery of a plurality of batteries.

Voltage measuring unit 110 may be communicatively connected to control unit 120. For example, voltage measuring unit 110 and control unit 120 may be connected wired and/or wirelessly. Voltage measuring unit 110 may transmit information about the measured voltages to control unit 120. In some embodiments, voltage measuring unit 110 may store the information about the measured voltages in storage unit 130.

Control unit 120 may be configured to calculate a voltage deviation of the plurality of batteries. In this regard, control unit 120 may receive voltage information of batteries from voltage measuring unit 110. Control unit 120 may calculate a voltage deviation of each battery based on the received voltage information. In some embodiments, control unit 120 may retrieve the voltage information of the batteries from storage unit 130 and may calculate a voltage deviation of each battery based on the retrieved voltage information.

FIG. 2 is a diagram schematically illustrating voltages for a plurality of battery cells, according to an embodiment of the present disclosure. While four batteries, Ba, Bb, Bc, and Bd are illustrated in FIG. 2, more or fewer batteries may be included in the plurality of batteries. Four batteries are illustrated by way of example, not limitation.

FIG. 2, illustrates voltages, in mV, for each battery. The voltages may be measured by voltage measuring unit 110. As shown, the measured voltage of the first battery Ba is Va, the measured voltage of the second battery Bb is Vb, the measured voltage of the third battery Bc is Vc, and the measured voltage of the fourth battery Bd is Vd.

The control unit 120 may be configured to calculate an average voltage of a plurality of batteries. As illustrated in FIG. 2, control unit 120 calculates an average voltage, Vavg, based on the voltages of batteries Ba, Bb, Bc, and Bd. For example, control unit 120 may determine Vavg by calculating the formula (Va+Vb+Vc+Vd)÷4. Control unit 120 may calculate Vavg at predetermined time period, discussed below. As such, Vavg corresponding to t1 may be calculated based on a plurality of voltage information for a plurality of batteries obtained at t1. Similarly, Vavg corresponding to t2 may be calculated based on a plurality of voltage information for a plurality of batteries obtained at t2. Therefore, each time period may correspond to a different Vavg.

The control unit 120 may be configured to calculate a voltage deviation of each battery of the plurality of batteries by calculating a difference between the calculated average voltage and the voltage of each battery of the plurality of batteries. In FIG. 2, control unit 120 may determine the voltage deviation of batteries Ba, Bb, Bc, and Bd by calculating the difference between the voltage of each of batteries Ba, Bb, Bc, Bd and Vavg. For example, control unit 120 may determine the voltage deviation of the first battery Ba, denoted as dVa, by calculating |Va−Vavg|. Similarly, the control unit 120 may determine the voltage deviation of the second battery Bb, denoted as dVb, by calculating |Vb−Vavg|. Control unit 120 may determine the voltage deviation of the third battery Bc, denoted as dVc, by calculating |Vc−Vavg| and may also determine the voltage deviation of the fourth battery Bd, denoted as dVd, by calculating |Vd−Vavg|. Here, "|" is an absolute value symbol, and the calculated voltage deviation can be expressed as an absolute value of the difference between a battery's voltage and the average voltage.

Control unit 120 may be configured to calculate the voltage deviation variation of each battery of the plurality of batteries at predetermined time periods. In some instances, the predetermined time periods may correspond to communication periods in which control unit 120 and voltage measuring unit 110 communicate with each other. For example, the time periods may be set to a period in which control unit 120 receives a plurality of voltage information from voltage measuring unit 110. Control unit 120 may calculate the voltage deviation variation of each battery of the plurality of batteries based on receiving the voltage information of the plurality of batteries from voltage measuring unit 110. In some instances, the time periods may remain constant over time to achieve diagnostic accuracy and consistency.

Control unit 120 may calculate a voltage deviation at each predetermined time period (or communication period) for each battery of the plurality of batteries. Here, the voltage deviation may be a voltage deviation of a plurality of batteries measured in a corresponding period (i.e., a voltage measurement time of the corresponding period). For instance, and as shown in FIG. 3, the voltage deviation of the first battery Ba calculated at time t0 is dV0, the voltage deviation of the first battery Ba calculated at time t1 is dV1, the voltage deviation of the first battery Ba calculated at time t2 is dV2, and the voltage deviation of the first battery Ba calculated at time t3 is dV3. For clarity, FIG. 3 shows only the voltage deviation of the first battery Ba calculated at times t0, t1, t2 and t3. Similar calculations may be made for the other batteries (i.e., Bb, Bc, Bd.)

Based on the determined voltage deviations, control unit 120 may calculate a voltage deviation variation. The voltage deviation variations may be determined between voltage deviations calculated in one cycle and the voltage deviation calculated in another cycle. For instance, and as shown in FIG. 3, voltage deviation variations may be determined between voltage deviations determined at successive times. For example, control unit 120 may calculate the voltage deviation variation $\Delta dV1$ by calculating the difference between the voltage deviations at time t0 and time t1 (dV1−dV0). Control unit 120 may calculate the voltage deviation variation $\Delta dV2$ by calculating the difference between the voltage deviations at time t1 and time t2 (dV2−dV1). Control unit 120 may calculate the voltage deviation variation as $\Delta dV3$ by calculating the difference between the voltage deviations at time t3 and time t2 (dV3−dV2). As only a single voltage deviation is known at time t0, no voltage deviation variation may be determined. The control unit 120 may calculate the voltage deviation variations of each of the plurality of batteries at each predetermined time period.

While only the voltage deviation and voltage deviation variation of the first battery Ba is shown in FIG. 3, it should be noted that the voltage deviations and the voltage deviation variations of the second, third and fourth batteries Bb, Bc, Bd are also calculated for diagnosing the state of the second to fourth batteries Bb, Bc, Bd.

Control unit 120 may be configured to diagnose the state of each battery of the plurality of batteries by comparing a pattern of voltage deviation variations of each battery of the plurality of batteries to preset diagnosis patterns.

Specifically, control unit 120 may be configured to diagnose the state of a corresponding battery by analyzing a pattern of a plurality of voltage deviation variations calculated for each battery. That is, control unit 120 may calculate the voltage deviation based on the voltages of a plurality of batteries, but the pattern of the voltage deviation variation may be judged based on only the plurality of voltage deviation variations of one battery.

For example, in FIG. 3, voltage deviations dV0, dV1, dV2, dV3 are values calculated based on the voltages of batteries Ba, Bb, Bc, and Bd at times t0, t1, t2 and t3, respectively. On the other hand, the voltage deviation variations $\Delta dV1$, $\Delta dV2$, $\Delta dV3$ are values calculated based on the voltage deviations dV0, dV1, dV2, dV3 of battery Ba. That is, the voltage deviation is based on the voltages of a plurality of batteries, but the voltage deviation variation is based on the voltage deviation of a single battery.

In FIG. 3, control unit 120 may determine a preset diagnosis pattern to which the pattern of the voltage deviation variations $\Delta dV1$, $\Delta dV2$, $\Delta dV3$ may correspond. Control unit 120 may diagnose the state of the first battery Ba based on the determined diagnosis pattern. Similarly, control unit 120 may diagnose the state of each of the second, third, and fourth batteries Bb, Bc, and Bd based on the voltage deviation variation pattern of each of the second, third, and fourth batteries Bb, Bc, and Bd.

Apparatus 100 for diagnosing a battery according to an embodiment of the present disclosure may diagnose the state of a single battery by considering both the voltage deviation patterns of a plurality of batteries and the voltage deviation variations of a single battery. That is, apparatus 100 for diagnosing a battery can individually diagnose the state of each battery by tracking the trend in the voltage deviation variation of the battery at each predetermined period.

For each battery of the plurality of batteries, control unit 120 may be configured to diagnose the state of the corresponding battery based on at least one diagnosis pattern that uses at least one of a sum, a magnitude, or an increase pattern of the plurality of voltage deviation variations calculated at the plurality of times.

Specifically, the diagnosis patterns may include a first diagnosis pattern corresponding to the sum of the plurality of voltage deviation variations, a second diagnosis pattern corresponding to the magnitude of each of the plurality of voltage deviation variations, a third diagnosis pattern corresponding to the maximum magnitude of the plurality of voltage deviation variations, and a fourth diagnosis pattern corresponding to the increase pattern of the plurality of voltage deviation variations.

For example, in FIG. 3, control unit 120 may diagnose the state of the first battery Ba based on at least one of the sum of ($\Delta dV1+\Delta dV2+\Delta dV3$), the magnitude of each of voltage deviation variation $\Delta dV1$, $\Delta dV2$, $\Delta dV3$, and the increase pattern of the plurality of voltage deviation variations $\Delta dV1$, $\Delta dV2$, $\Delta dV3$ calculated at the plurality of times t1, t2, t3 of battery Ba.

Hereinafter, examples of the diagnosis pattern will be described in detail with reference to FIGS. 4 to 11. For convenience of explanation, $\Delta dV1$ calculated at time t1 is called a first voltage deviation variation ($\Delta dV1$), $\Delta dV2$ calculated at time t2 is called a second voltage deviation variation ($\Delta dV2$), and $\Delta dV3$ calculated at time t3 is called a third voltage deviation variation ($\Delta dV3$).

Figure 4:
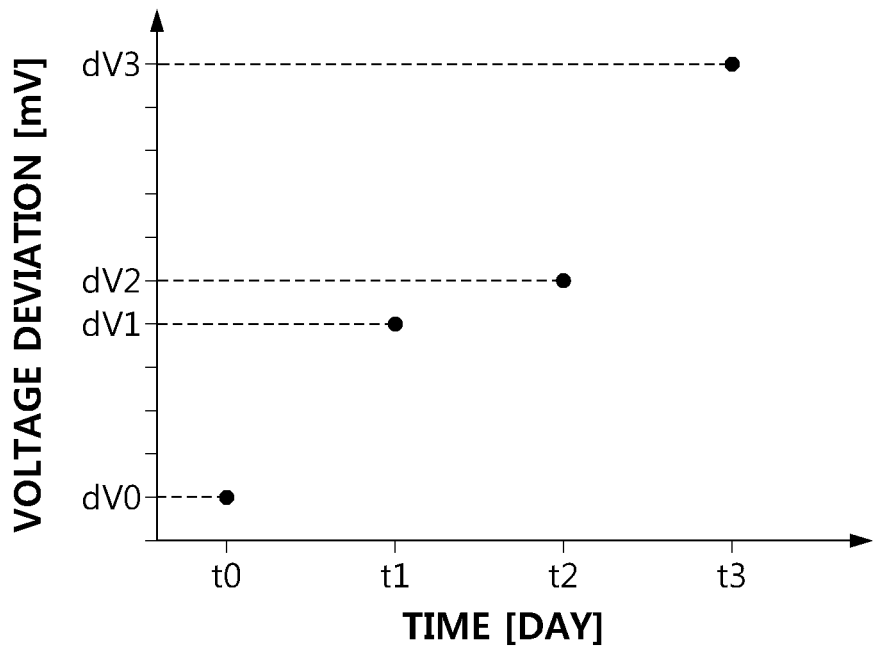
FIGS. 4 and 5 illustrate an example first diagnosis pattern, in accordance with aspects of the disclosure.
Figure 4:
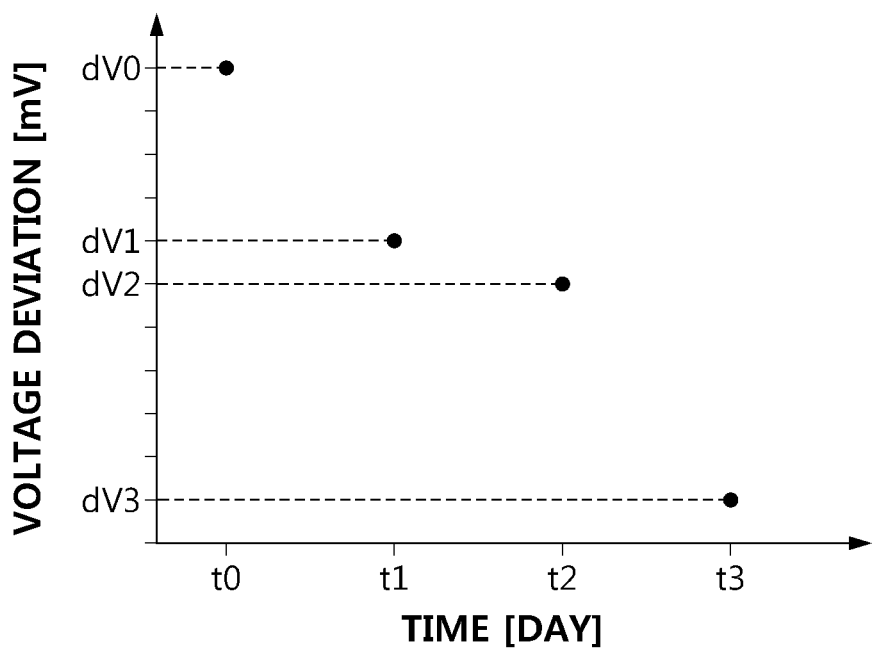
Figure 5:
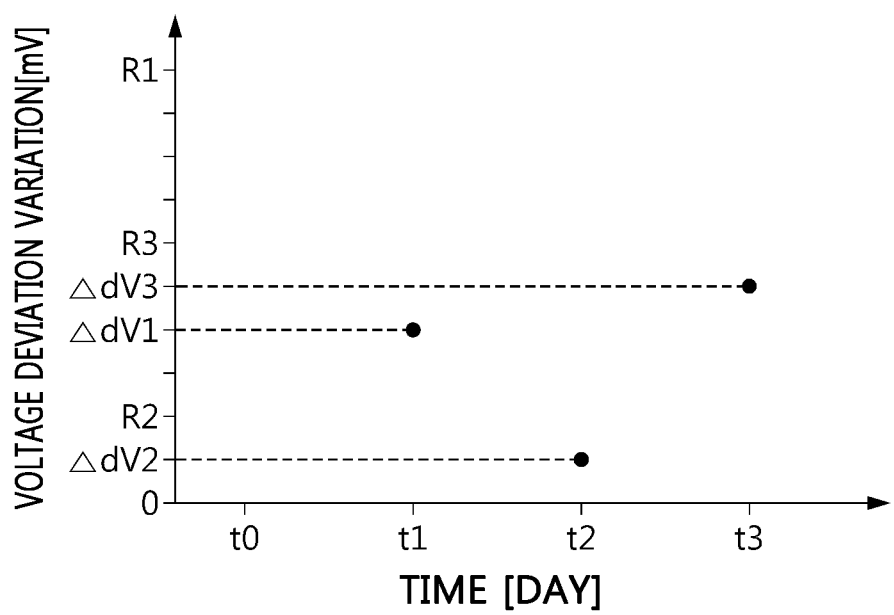

FIGS. 4 and 5 are diagrams schematically showing an embodiment of a first diagnosis pattern. Specifically, FIG. 4 is a diagram schematically showing an embodiment of the voltage deviation over time of the first diagnosis pattern. FIG. 5 is a diagram schematically showing an embodiment of the voltage deviation variation over time of the first diagnosis pattern based on the FIG. 4.

When the plurality of voltage deviation variations are positive numbers and the sum of the plurality of voltage deviation variations of a battery is greater than or equal to a first preset criterion value (R1), control unit 120 may determine that the pattern of the voltage deviation variations corresponds to the first diagnosis pattern and may diagnose that an internal micro short circuit occurred in the battery. When the voltage deviation variation is a positive value, the voltage deviation of the current period increased compared to the voltage deviation of the previous period. In other words, the difference between the voltage of the battery and the voltage of other batteries increased in the current period compared to the previous period. In some instances, the difference between the battery's voltage and the voltages of other batteries may decrease when compared to the previous period, thereby resulting in a voltage deviation variation of 0 or a negative value.

The criterion values discussed herein may correspond to values gathered during product testings. For example, the first criterion value (R1) may be set to 10 mV.

For example, and as further illustrated in FIG. 5, the first voltage deviation variation ($\Delta$dV1), the second voltage deviation variation ($\Delta$dV2), and the third voltage deviation variation ($\Delta$dV3) are positive numbers. The first diagnostic pattern may require at least two time periods, such as t0-t1, t1-t2, or the like. This is because if $\Delta$dV1 at t1 is greater than or equal to R1, the first diagnosis pattern is satisfied. In some instances, the time periods may remain constant over time to achieve diagnostic accuracy and consistency.

Also, the sum of the first voltage deviation variation ($\Delta$dV1), the second voltage deviation variation ($\Delta$dV2), and the third voltage deviation variation ($\Delta$dV3) are greater than or equal to the first criterion value (R1). The sum of the first voltage deviation variation ($\Delta$dV1), the second voltage deviation variation ($\Delta$dV2), and the third voltage deviation variation ($\Delta$dV3) may exceed 10 mV.

Control unit 120 may determine the sum of the voltage deviation variations by calculating ($\Delta$dV1+$\Delta$dV2+$\Delta$dV3). The control unit 120 may compare the determined sum to the first criterion value (R1). In the example illustrated in FIG. 5, the calculated sum is equal to or greater than the first criterion value (R1), thus, control unit 120 may diagnose that an internal micro short circuit occurred in the battery. While only three deviation variation values are used in the examples described herein, more or less than three deviation variation values may be used to diagnose an internal micro short circuit inside the battery. Three deviation variation values are used for example purposes only, not limitation.

Figure 6:
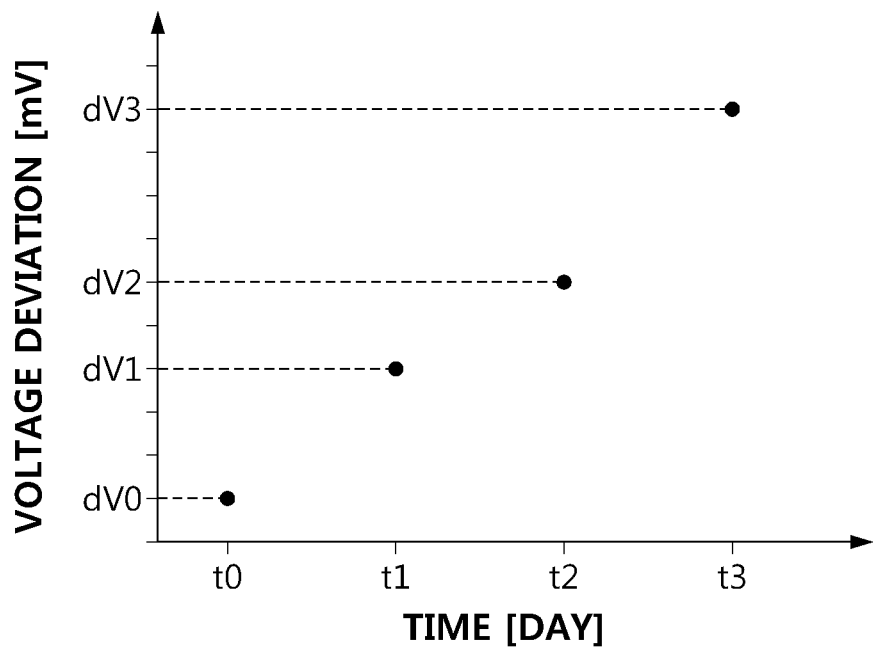
FIGS. 6 and 7 illustrate an example second diagnosis pattern, in accordance with aspects of the disclosure.
Figure 6:
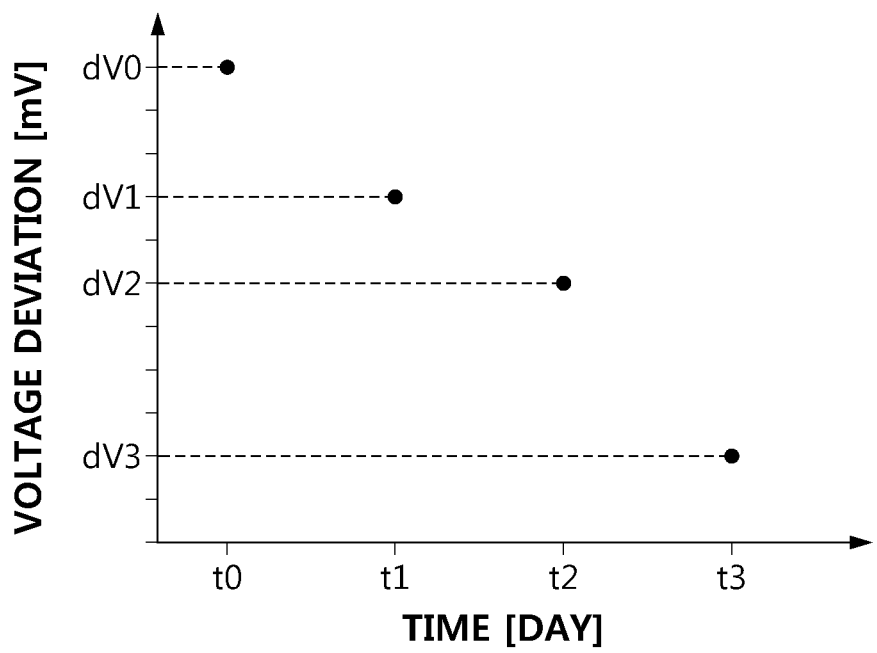
Figure 7:
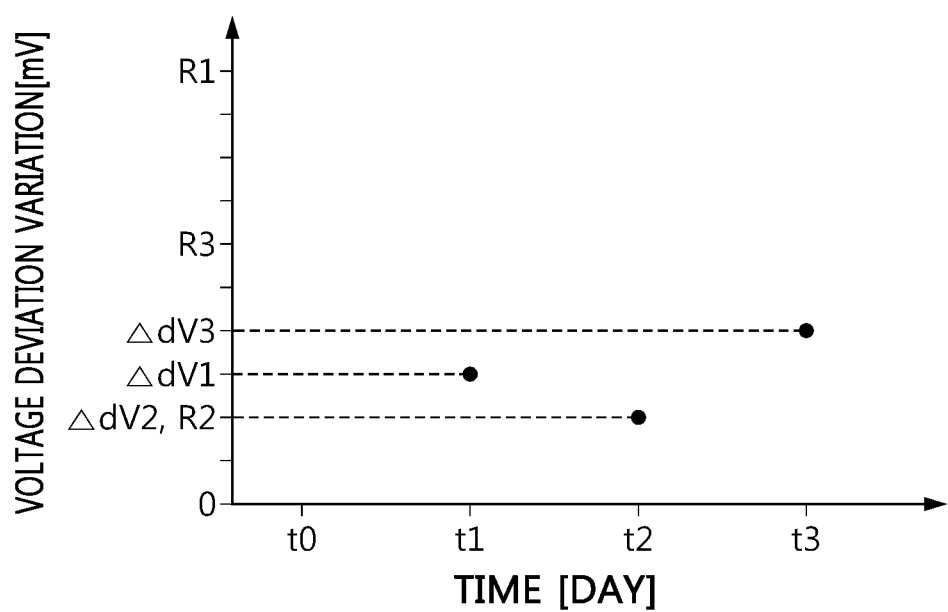

FIGS. 6 and 7 are diagrams schematically showing an embodiment of a second diagnosis pattern. Specifically, FIG. 6 is a diagram schematically showing an embodiment of the voltage deviation over time of the second diagnosis pattern. FIG. 7 is a diagram schematically showing an embodiment of the voltage deviation variation over time of the second diagnosis pattern based on the FIG. 6.

When the plurality of voltage deviation variations are greater than a second preset criterion value (R2), control unit 120 may determine that the voltage deviation variation pattern corresponds to the second diagnosis pattern and may diagnose that an internal micro short circuit occurred in the battery. The second diagnostic pattern may require at least two time periods, such as t0-t1, t1-t2, or the like. This is because whether or not the diagnostic pattern is satisfied is determined depending on the change in, at least, $\Delta$dV1 and $\Delta$dV2. In some instances, the time periods may remain constant over time to achieve diagnostic accuracy and consistency.

For example, in FIG. 7, the first voltage deviation variation ($\Delta$dV1), the second voltage deviation variation ($\Delta$dV2), and the third voltage deviation variation ($\Delta$dV3) may be positive numbers. Also, the magnitudes of the first voltage deviation variation ($\Delta$dV1), the second voltage deviation variation ($\Delta$dV2), and the third voltage deviation variation ($\Delta$dV3) may be greater than or equal to the second criterion value (R2).

In one embodiment, the second criterion value (R2) may be set to a value less than the first criterion value (R1). For example, the first criterion value (R1) may be set to 10 mV, and the second criterion value (R2) may be set to 2 mV. When (R2) is equal to or greater than (R1), the first diagnosis pattern is satisfied when the second diagnosis pattern is satisfied. Therefore, in order to determine whether the voltage deviation variation is maintained above the second criterion value (R2), (R2) is set to be less than (R1).

Control unit 120 may compare each of the first voltage deviation variation ($\Delta$dV1), the second voltage deviation variation ($\Delta$dV2), and the third voltage deviation variation ($\Delta$dV3) to the second criterion value (R2). In the example illustrated in FIG. 7, the first voltage deviation variation ($\Delta$dV1), the second voltage deviation variation ($\Delta$dV2), and the third voltage deviation variation ($\Delta$dV3) are all equal to or greater than the second criterion value (R2). Thus, control unit 120 may diagnose that an internal micro short circuit occurred in the battery.

Figure 8:
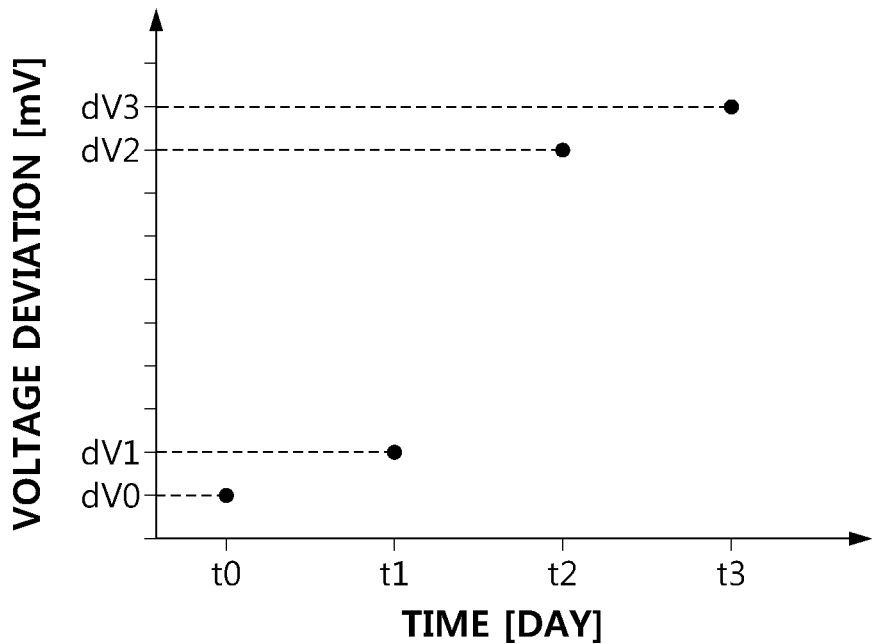
FIGS. 8 and 9 illustrate an example third diagnosis pattern, in accordance with aspects of the disclosure.
Figure 8:
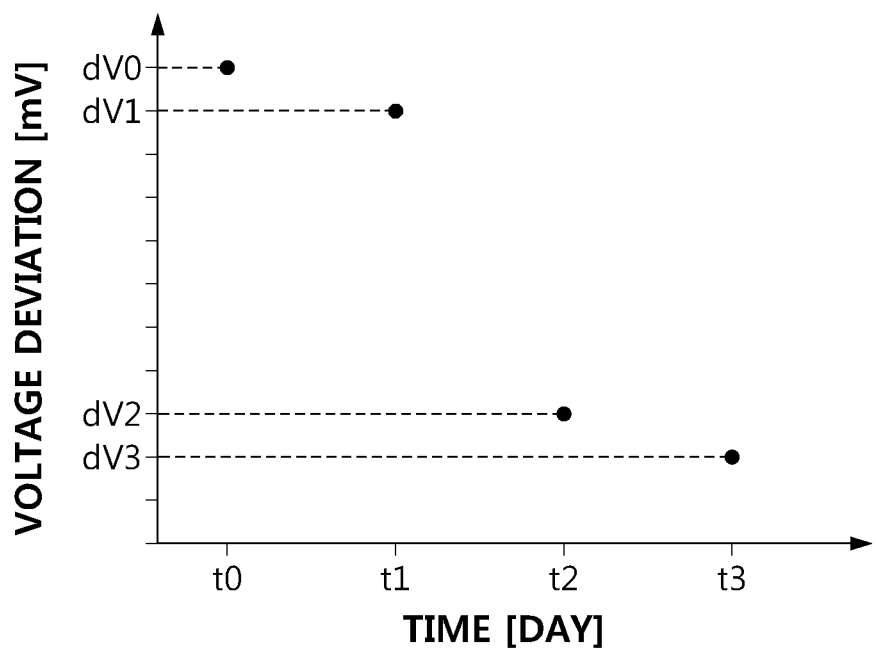
Figure 9:
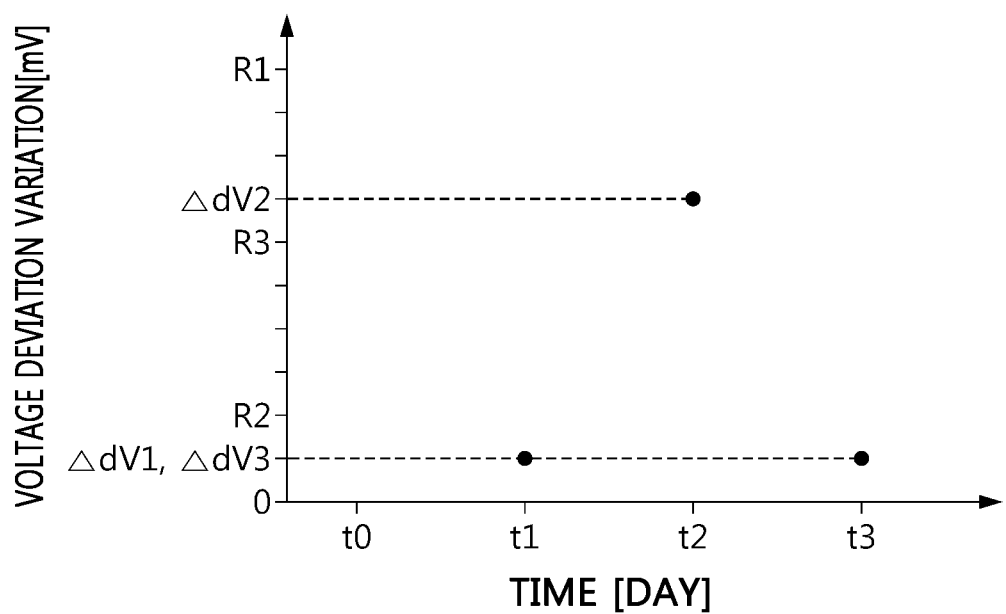

FIGS. 8 and 9 are diagrams schematically showing an embodiment of a third diagnosis pattern. Specifically, FIG. 8 is a diagram schematically showing an embodiment of the voltage deviation over time of the third diagnosis pattern. FIG. 9 is a diagram schematically showing an embodiment of the voltage deviation variation over time of the third diagnosis pattern based on the FIG. 8.

When the plurality of voltage deviation variations are positive numbers and at least one of the plurality of voltage deviation variations is greater than or equal to a third preset criterion value (R3), control unit 120 may determine that the pattern of the voltage deviation variation corresponds to the third diagnosis pattern and may diagnose that an internal micro short circuit occurred in the battery. The third diagnostic pattern may require at least two time periods, such as t0-t1, t1-t2, or the like. This is because whether or not the diagnostic pattern is satisfied is determined depending on the change in, at least, $\Delta$dV1 and $\Delta$dV2. In some instances, the time periods may remain constant over time to achieve diagnostic accuracy and consistency.

For example, in FIG. 9, the first voltage deviation variation ($\Delta$dV1), the second voltage deviation variation ($\Delta$dV2), and the third voltage deviation variation ($\Delta$dV3) may be positive numbers. In addition, the magnitude of the second voltage deviation variation ($\Delta$dV2) among the first voltage deviation variation ($\Delta$dV1), the second voltage deviation variation ($\Delta$dV2), and the third voltage deviation variation ($\Delta$dV3) may be greater than or equal to the third criterion value (R3). That is, the maximum magnitude among the first voltage deviation variation ($\Delta$dV1), the second voltage deviation variation ($\Delta$dV2), and the third voltage deviation variation ($\Delta$dV3) may be greater than or equal to the third criterion value (R3).

In some instances, the third criterion value (R3) may be configured to be less than the first preset criterion value (R1) that corresponds to the first diagnosis pattern and to exceed the second preset criterion value (R2) that corresponds to the second diagnosis pattern. For example, the first criterion value (R1) may be set to 10 mV, the second criterion value (R2) may be set to 2 mV, and the third criterion value (R3) may be set to 6 mV.

Control unit 120 may compare the maximum magnitude of the first voltage deviation variation ($\Delta$dV1), the second voltage deviation variation ($\Delta$dV2), and the third voltage deviation variation ($\Delta$dV3) with the third criterion value (R3). In FIG. 9, since the second voltage deviation variation ($\Delta$dV2) is greater than or equal to the third criterion value (R3), control unit 120 may diagnose that an internal micro short circuit occurred in the battery.

Figure 10:
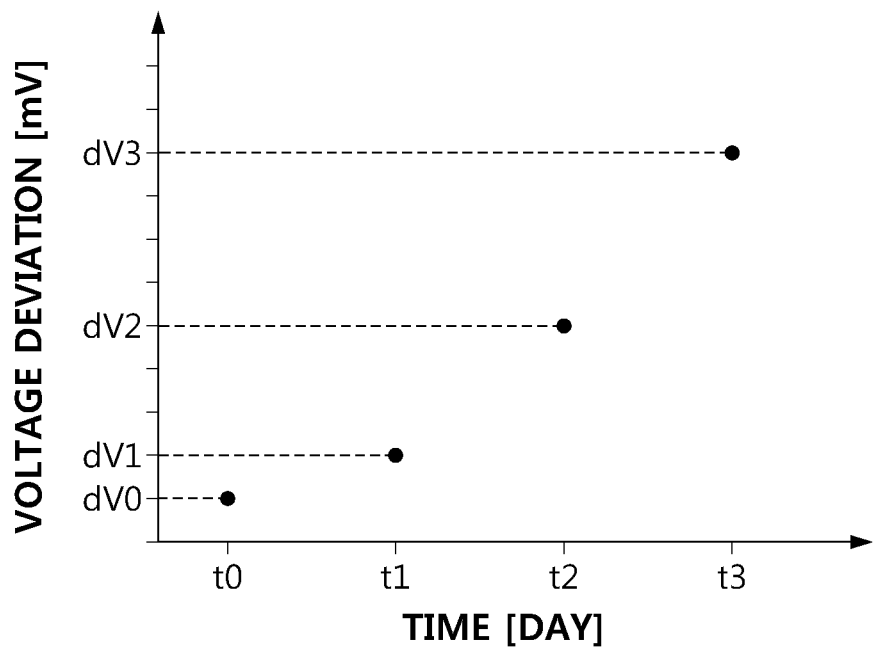
FIGS. 10 and 11 illustrate an example fourth diagnosis pattern, in accordance with aspects of the disclosure.
Figure 10:
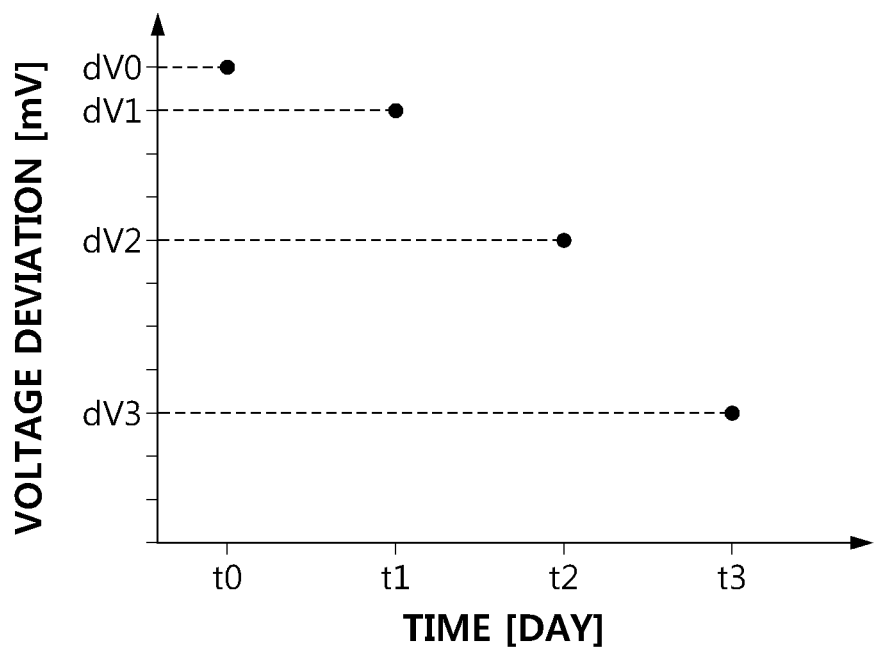
Figure 11:
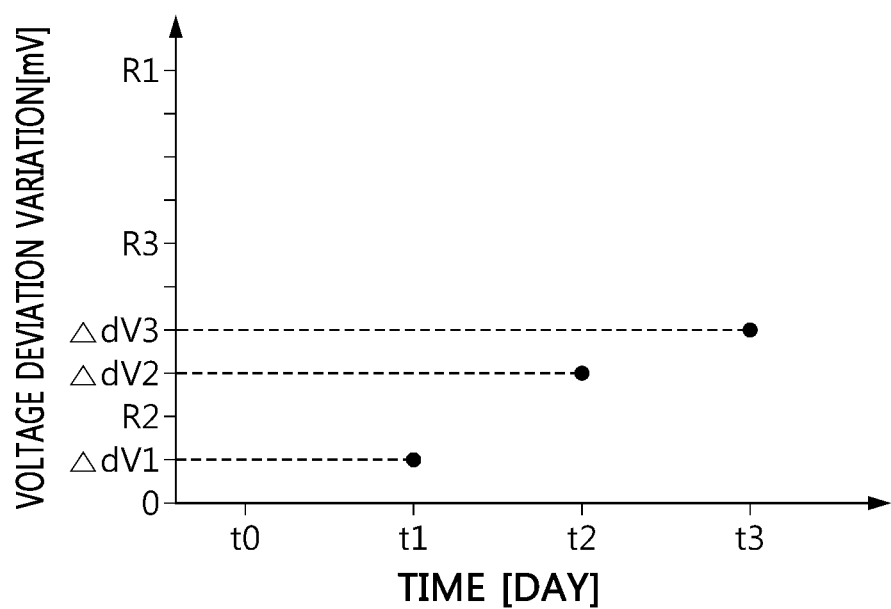

FIGS. 10 and 11 are diagrams schematically showing an embodiment of a fourth diagnosis pattern. Specifically, FIG.

10 is a diagram schematically showing an embodiment of the voltage deviation over time of the fourth diagnosis pattern. FIG. 11 is a diagram schematically showing an embodiment of the voltage deviation variation over time of the fourth diagnosis pattern based on the FIG. 10.

When the plurality of voltage deviation variations are positive numbers and the plurality of voltage deviation variations increase over time, control unit 120 may determine that the pattern of the voltage deviation variations corresponds to the fourth diagnosis pattern and may diagnose that an internal micro short circuit occurred in the battery. The fourth diagnostic pattern may require at least two time periods, such as t0-t1, t1-t2, t2-t3, or the like. This is because whether or not the diagnostic pattern is satisfied is determined depending on the change in, at least, $\Delta dV1$ and $\Delta dV2$. In some instances, the time periods may remain constant over time to achieve diagnostic accuracy and consistency.

For example, in FIG. 11, the first voltage deviation variation ($\Delta dV1$), the second voltage deviation variation ($\Delta dV2$), and the third voltage deviation variation ($\Delta dV3$) may correspond to an increase voltage deviation variation pattern. That is, the first voltage deviation variation ($\Delta dV1$), the second voltage deviation variation ($\Delta dV2$), and the third voltage deviation variation ($\Delta dV3$) may gradually increase over time (i.e., as time elapses in the order of times t1, t2, and t3). For example, the first voltage deviation variation ($\Delta dV1$) may be less than the second voltage deviation variation ($\Delta dV2$), and the second voltage deviation variation ($\Delta dV2$) may be less than the third voltage deviation variation ($\Delta dV3$).

Control unit 120 may compare the magnitudes of the first voltage deviation variation ($\Delta dV1$), the second voltage deviation variation ($\Delta dV2$), and the third voltage deviation variation ($\Delta dV3$) to determine whether a pattern of the voltage deviation variations of the battery corresponds to a voltage deviation variation increase pattern. In FIG. 11, since the first voltage deviation variation ($\Delta dV1$), the second voltage deviation variation ($\Delta dV2$), and the third voltage deviation variation ($\Delta dV3$) increase over the determined time periods t0-t3, control unit 120 may diagnose that an internal micro short circuit occurred in the battery.

Control unit 120 may be configured to diagnose that an internal micro short circuit has occurred in the battery if the pattern of the plurality of voltage deviation variations corresponds to any one of the diagnosis patterns.

In some embodiments, the pattern of the plurality of voltage deviation variations ($\Delta dV1$, $\Delta dV2$, $\Delta dV3$) may correspond to the first diagnosis pattern, but might not correspond to the second, third, or fourth diagnosis patterns. For example, since the second voltage deviation variation ($\Delta dV2$) is less than the second criterion value (R2), the pattern of the plurality of voltage deviation variations ($\Delta dV1$, $\Delta dV2$, $\Delta dV3$) might not correspond to the second diagnosis pattern. In addition, since the maximum magnitude of the plurality of voltage deviation variations ($\Delta dV1$, $\Delta dV2$, $\Delta dV3$) is less than the third criterion value (R3), the pattern of the plurality of voltage deviation variations ($\Delta dV1$, $\Delta dV2$, $\Delta dV3$) might not correspond to the third diagnosis pattern. Also, since the second voltage deviation variation ($\Delta dV2$) is smaller than the first voltage deviation variation ($\Delta dV1$), the pattern of the plurality of voltage deviation variations ($\Delta dV1$, $\Delta dV2$, $\Delta dV3$) might not correspond to the fourth diagnosis pattern.

In some embodiments, the pattern of the plurality of voltage deviation variations ($\Delta dV1$, $\Delta dV2$, $\Delta dV3$) may correspond to the second diagnosis pattern, but might not correspond to the first diagnosis pattern, the third diagnosis pattern, or the fourth diagnosis pattern. For example, since the sum of the first voltage deviation variation ($\Delta dV1$), the second voltage deviation variation ($\Delta dV2$), and the third voltage deviation variation ($\Delta dV3$) is less than the first criterion value (R1), the pattern of the plurality of voltage deviation variations ($\Delta dV1$, $\Delta dV2$, $\Delta dV3$) might not correspond to the first diagnosis pattern. In addition, since the maximum magnitude of the plurality of voltage deviation variations ($\Delta dV1$, $\Delta dV2$, $\Delta dV3$) is less than the third criterion value (R3), the pattern of the plurality of voltage deviation variations ($\Delta dV1$, $\Delta dV2$, $\Delta dV3$) might not correspond to the third diagnosis pattern. Also, since the second voltage deviation variation ($\Delta dV2$) is smaller than the first voltage deviation variation ($\Delta dV1$), the pattern of the plurality of voltage deviation variations ($\Delta dV1$, $\Delta dV2$, $\Delta dV3$) might not correspond to the fourth diagnosis pattern.

In some embodiments, the pattern of the plurality of voltage deviation variations ($\Delta dV1$, $\Delta dV2$, $\Delta dV3$) may correspond to the third diagnosis pattern, but might not correspond to the first diagnosis pattern, the second diagnosis pattern, or the fourth diagnosis pattern. For example, since the sum of the first voltage deviation variation ($\Delta dV1$), the second voltage deviation variation ($\Delta dV2$), and the third voltage deviation variation ($\Delta dV3$) is less than the first criterion value (R1), the pattern of the plurality of voltage deviation variations ($\Delta dV1$, $\Delta dV2$, $\Delta dV3$) might not correspond to the first diagnosis pattern. In addition, since the first voltage deviation variation ($\Delta dV1$) and the third voltage deviation variation ($\Delta dV3$) are less than the second criterion value (R2), the pattern of the plurality of voltage deviation variations ($\Delta dV1$, $\Delta dV2$, $\Delta dV3$) might not correspond to the second diagnosis pattern. In addition, since the third voltage deviation variation ($\Delta dV3$) is smaller than the second voltage deviation variation ($\Delta dV2$), the pattern of the plurality of voltage deviation variations ($\Delta dV1$, $\Delta dV2$, $\Delta dV3$) might not correspond to the fourth diagnosis pattern.

In some embodiments, the pattern of the plurality of voltage deviation variations ($\Delta dV1$, $\Delta dV2$, $\Delta dV3$) may correspond to the fourth diagnosis pattern, but might not correspond to the first diagnosis pattern, the second diagnosis pattern, or the third diagnosis pattern. For example, since the sum of the first voltage deviation variation ($\Delta dV1$), the second voltage deviation variation ($\Delta dV2$), and the third voltage deviation variation ($\Delta dV3$) is less than the first criterion value (R1), the pattern of the plurality of voltage deviation variations ($\Delta dV1$, $\Delta dV2$, $\Delta dV3$) might not correspond to the first diagnosis pattern. In addition, since the first voltage deviation variation ($\Delta dV1$) is less than the second criterion value (R2), the pattern of the plurality of voltage deviation variations ($\Delta dV1$, $\Delta dV2$, $\Delta dV3$) might not correspond to the second diagnosis pattern. In addition, since the maximum magnitude of the plurality of voltage deviation variations ($\Delta dV1$, $\Delta dV2$, $\Delta dV3$) is less than the third criterion value (R3), the patterns of the plurality of voltage deviation variations ($\Delta dV1$, $\Delta dV2$, $\Delta dV3$) might not correspond to the third diagnosis pattern.

In some embodiments, the pattern of the plurality of voltage deviation variations ($\Delta dV1$, $\Delta dV2$, $\Delta dV3$) may correspond to any one of the first to fourth diagnosis patterns. As such, if the patterns of the plurality of voltage deviation variations ($\Delta dV1$, $\Delta dV2$, $\Delta dV3$) correspond to any one diagnosis pattern, apparatus 100 for diagnosing a battery may diagnose that an internal micro short circuit occurred in the battery. That is, apparatus 100 for diagnosing a battery may prevent a hard short from occurring in the battery in an unexpected situation by sensitively and strictly diagnosing the state of the battery.

In some embodiments, the control unit 120 may be configured to sequentially compare the patterns of the plurality of voltage deviation variations ($\Delta dV1$, $\Delta dV2$, $\Delta dV3$) with the first to fourth diagnostic patterns. Specifically, the control unit 120 can sequentially compare the patterns of the plurality of voltage deviation variations ($\Delta dV1$, $\Delta dV2$, $\Delta dV3$) with a first diagnostic pattern, a second diagnostic pattern, a third diagnostic pattern, and a fourth diagnostic pattern.

For example, the control unit 120 may confirm whether the patterns of the plurality of voltage deviation variations ($\Delta dV1$, $\Delta dV2$, $\Delta dV3$) correspond to the first diagnosis pattern. If the patterns of the plurality of voltage deviation variations ($\Delta dV1$, $\Delta dV2$, $\Delta dV3$) correspond to the first diagnosis pattern, the control unit 120 may diagnose that an internal micro short circuit has occurred in the battery.

If the patterns of the plurality of voltage deviation variations ($\Delta dV1$, $\Delta dV2$, $\Delta dV3$) do not correspond to the first diagnosis pattern, the control unit 120 may confirm whether the patterns of the plurality of voltage deviation variations ($\Delta dV1$, $\Delta dV2$, $\Delta dV3$) correspond to the second diagnosis pattern. If the patterns of the plurality of voltage deviation variations ($\Delta dV1$, $\Delta dV2$, $\Delta dV3$) correspond to the second diagnosis pattern, the control unit 120 may diagnose that an internal micro short circuit has occurred in the battery.

If the patterns of the plurality of voltage deviation variations ($\Delta dV1$, $\Delta dV2$, $\Delta dV3$) do not correspond to the second diagnosis pattern, the control unit 120 may confirm whether the patterns of the plurality of voltage deviation variations ($\Delta dV1$, $\Delta dV2$, $\Delta dV3$) correspond to the third diagnosis pattern. If the patterns of the plurality of voltage deviation variations ($\Delta dV1$, $\Delta dV2$, $\Delta dV3$) correspond to the third diagnosis pattern, the control unit 120 may diagnose that an internal micro short circuit has occurred in the battery.

If the patterns of the plurality of voltage deviation variations ($\Delta dV1$, $\Delta dV2$, $\Delta dV3$) do not correspond to the third diagnosis pattern, the control unit 120 may confirm whether the patterns of the plurality of voltage deviation variations ($\Delta dV1$, $\Delta dV2$, $\Delta dV3$) correspond to the fourth diagnosis pattern. If the patterns of the plurality of voltage deviation variations ($\Delta dV1$, $\Delta dV2$, $\Delta dV3$) correspond to the fourth diagnosis pattern, the control unit 120 may diagnose that an internal micro short circuit has occurred in the battery.

If the patterns of the plurality of voltage deviation variations ($\Delta dV1$, $\Delta dV2$, $\Delta dV3$) do not correspond to the fourth diagnosis pattern, the control unit 120 may diagnose that an internal micro short circuit has not occurred in the battery.

The battery diagnosis device 100 can diagnose whether an internal micro short circuit has occurred in the battery through a process of sequentially comparing the patterns of a plurality of voltage deviation changes ($\Delta dV1$, $\Delta dV2$, $\Delta dV3$) with the first to fourth diagnosis patterns. While the preceding example describes sequentially comparing the patterns of the plurality of voltage deviation variations ($\Delta dV1$, $\Delta dV2$, $\Delta dV3$) with the first to fourth diagnostic patterns, in some instances, the patterns of the plurality of voltage deviation variations may be compared in any order.

In some embodiments, when the plurality of voltage deviation variations are positive numbers, control unit 120 may be configured to compare the pattern of the voltage deviation variations of a corresponding battery to a preset diagnosis pattern.

Specifically, the first to fourth diagnosis patterns may be based on the case where the plurality of voltage deviation variations are positive numbers. For example, in FIGS. 4 to 7, the plurality of voltage deviation variations ($\Delta dV1$, $\Delta dV2$, $\Delta dV3$) may all be positive numbers. That is, a battery with an internal micro short circuit may gradually increase its voltage deviation from other batteries as time passes. Accordingly, control unit 120 may compare the pattern of the plurality of voltage deviation variations to the preset diagnosis pattern only for batteries in which the plurality of voltage deviation variations are all positive numbers in order to efficiently use system resources.

Based on determining an internal micro short circuit occurred within at least one battery, apparatus 100 may be configured to transmit a signal to an external device where the signal contains a battery diagnosis that corresponds to a battery of the plurality of batteries. In some embodiments, apparatus 100 may transmit a plurality of signals where each signal indicates a battery diagnosis of different batteries within the plurality of batteries. The external device may include at least one of an onboard vehicle system, an external vehicle system, one or more servers configured to communicate with a vehicle, or a mobile device configured to communicate with the vehicle.

Figure 12:
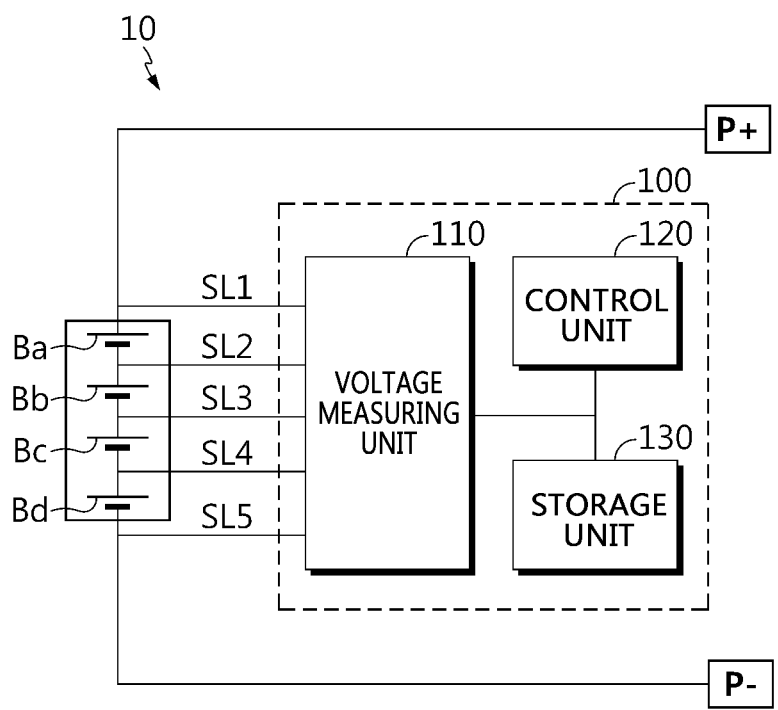
FIG. 12 illustrates an example configuration of a battery pack, in accordance with aspects of the disclosure.

FIG. 12 is a diagram showing an example configuration of a battery pack according to some embodiments of the present disclosure. Battery pack 10 may include apparatus 100 for diagnosing a battery. Apparatus 100 for diagnosing a battery according to the present disclosure may be applied to a battery management system (BMS). In some embodiments, apparatus 100 may be implemented on a BMS chip, where the BMS chip may be an application-specific integrated circuit (ASIC), a system-on-chip (SoC), or the like. Further, in some embodiments, the BMS or BMS chip may exist within a vehicle. That is, the BMS according to the present disclosure may include apparatus 100 for diagnosing a battery described above. In this configuration, at least some of components of apparatus 100 for diagnosing a battery may be implemented by supplementing or adding functions of the components included in a conventional BMS. For example, voltage measuring unit 110, control unit 120, and storage unit 130 of apparatus 100 for diagnosing a battery may be implemented as components of the BMS. In some instances, the described process may be implemented via a BMS software update.

In some embodiments, apparatus 100 may be configured to operate independently of a BMS or a BMS chip that is integrated into the vehicle. For example, apparatus 100 may be configured to operate remotely using at least one remote computing device.

Battery pack 10, according to the present disclosure, may include the above-described apparatus 100 for diagnosing a battery and one or more battery cells. In addition, battery pack 10 may further include electrical components (e.g., a relay, a fuse, and the like) and a case.

Battery pack 10 may include a first battery Ba, a second battery Bb, a third battery Bc, and a fourth battery Bd. For example, in FIG. 12, the first battery Ba, the second battery Bb, the third battery Bc, and the fourth battery Bd may be connected in series. It should be noted that the number of batteries included in battery pack 10 and the connection relationship (serial and/or parallel) of the batteries are not limited by the embodiment of FIG. 12. Four batteries connected in series are depicted for illustration purposes only, not limitation.

A positive electrode terminal of the first battery Ba may be connected to a positive electrode terminal P+ of battery pack 10, and a negative electrode terminal of the fourth battery Bd may be connected to a negative electrode terminal P− of battery pack 10.

Voltage measuring unit 110 may be connected to a first sensing line SL1, a second sensing line SL2, a third sensing line SL3, a fourth sensing line SL4, and a fifth sensing line SL5.

Specifically, voltage measuring unit 110 may be connected to the positive electrode terminal of the first battery Ba through the first sensing line SL1, and may be connected to the negative electrode terminal of the first battery Ba through the second sensing line SL2. Voltage measuring unit 110 may measure the voltage of the first battery Ba based on the voltage measured at each of the first sensing line SL1 and the second sensing line SL2.

Similarly, voltage measuring unit 110 may measure the voltage of the second battery Bb through the second sensing line SL2 and the third sensing line SL3, measure the voltage of the third battery Bc through the third sensing line SL3 and the fourth sensing line SL4, and measure the voltage of the fourth battery Bd through the fourth sensing line SLA and the fifth sensing line SL5.

An external device may be connected to the positive terminal P+ and the negative terminal P− of battery pack 10. For example, the external device may be a motor of an electric vehicle receiving power from battery pack 10. As another example, the external device may be a charging device for charging battery pack 10.

Figure 13:
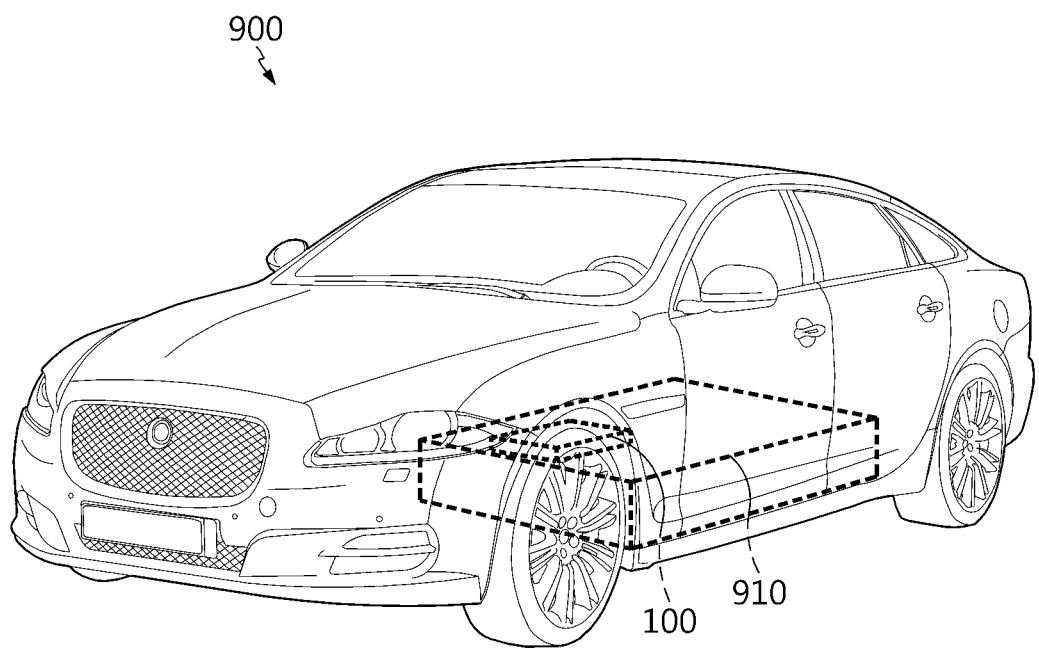
FIG. 13 illustrates an example vehicle, in accordance with aspects of the disclosure.

FIG. 13 is a diagram schematically showing a vehicle according to still another embodiment of the present disclosure.

Referring to FIG. 13, battery pack 910 according to an embodiment of the present disclosure may be included in vehicle 900 such as an electric vehicle (EV) or a hybrid vehicle (HV). In addition, battery pack 910 may drive vehicle 900 by supplying power to a motor through an inverter included in vehicle 900. In addition, battery pack 910 may include apparatus 100 for diagnosing a battery according to an embodiment of the present disclosure.

Figure 14:
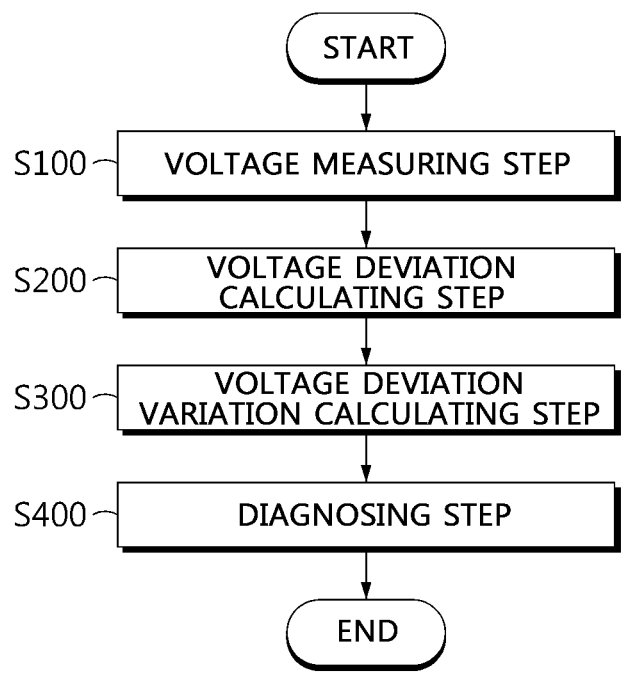
FIG. 14 illustrates an example method for diagnosing a battery, in accordance with aspects of the disclosure.

FIG. 14 is a diagram schematically showing a method for diagnosing a battery according to still another embodiment of the present disclosure.

In some embodiments, each step of the method for diagnosing a battery may be performed by apparatus 100.

At block S100, voltage measuring unit 110 may measure voltages of a plurality of batteries.

For example, voltage measuring unit 110 may measure the voltage of each battery of the plurality of batteries.

As illustrated in FIG. 2, voltage measuring unit 110 may measure voltages of a first battery Ba, a second battery Bb, a third battery Bc, and a fourth battery Bd as Va, Vb, Vc, and Vd, respectively.

At block S200, control unit 120 may calculate a voltage deviation of the plurality of batteries.

For example, control unit 120 may calculate an average voltage of the plurality of batteries. In addition, the control unit 120 may calculate a voltage deviation of each battery of the plurality of batteries by calculating a difference between the calculated average voltage and the voltage of each battery of the plurality of batteries.

As illustrated in FIG. 2, control unit 120 may calculate the average voltage of the first battery Ba, the second battery Bb, the third battery Bc, and the fourth battery Bd as Vavg. Control unit 120 may calculate the voltage deviations of the first battery Ba, the second battery Bb, the third battery Bc, and the fourth battery Bd as dVa, dVb, dVc and dVd, respectively, by calculating the difference between the voltage of the first battery Ba, the second battery Bb, the third battery Bc, and the fourth battery Bd and the average voltage.

At block S300, control unit 120 may calculate a voltage deviation variation of each battery of the plurality of batteries at predetermined time periods.

For example, control unit 120 may calculate a variation between the voltage deviations calculated at each predetermined time period for each battery of the plurality of batteries.

As illustrated in FIG. 3, control unit 120 may calculate the voltage deviation variation of the first battery Ba as ΔdV1, ΔdV2, and ΔdV3 at times t1, t2, and t3.

At block S400, control unit 120 may diagnose the state of each battery of the plurality of batteries by comparing a pattern of the voltage deviation variations of each battery of the plurality of batteries to a preset diagnosis pattern.

For example, control unit 120 may be configured to diagnose the state of a battery by analyzing the pattern of a plurality of voltage deviation variations calculated for the battery.

As illustrated in FIG. 3, control unit 120 may determine a diagnosis pattern to which the pattern of the voltage deviation variations (ΔdV1, ΔdV2, ΔdV3) belongs. Also, control unit 120 may diagnose the state of the first battery Ba to correspond to the determined diagnosis pattern.

The embodiments of the present disclosure described above might not be implemented only through an apparatus and a method, but may be implemented through a program that realizes a function corresponding to the configuration of the embodiments of the present disclosure or computer-readable medium (CRM) on which the program is recorded. The program or (CRM) may be implemented by those skilled in the art from the above description of the embodiments or variations thereof.

The present disclosure has been described in detail. However, it should be understood that the detailed description and specific examples, while indicating example embodiments of the disclosure, are given by way of illustration only, since various changes and modifications within the scope of the disclosure will become apparent to those skilled in the art from this detailed description.

Additionally, substitutions, modifications, and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

EXPLANATION OF REFERENCE SIGNS

10: battery pack
100: apparatus for diagnosing a battery
110: voltage measuring unit
120: control unit
130: storage unit
900: vehicle
910: battery pack
Ba: first battery
Bb: second battery
Bc: third battery
Bd: fourth battery

What is claimed is:

1. A battery diagnosing apparatus, comprising:
one or more processors configured to:
obtain voltages of a plurality of batteries;
calculate a voltage deviation of the plurality of batteries;
calculate a voltage deviation variation of each battery of the plurality of batteries at predetermined time periods;
compare a pattern of the voltage deviation variation of each battery of the plurality of batteries with a preset diagnosis pattern to diagnose a state of each battery of the plurality of batteries; and
output one or more signals to an external device wherein each signal indicates a battery diagnosis for each battery of the plurality of batteries.

2. The apparatus of claim 1,
wherein the one or more processors are further configured to diagnose a state of a corresponding battery based on at least one of a sum, a magnitude, or an increase pattern of a plurality of voltage deviation variations calculated at a plurality of times for each battery of the plurality of batteries.

3. The apparatus of claim 2,
wherein when the plurality of voltage deviation variations are positive numbers, the one or more processors are configured to compare the pattern of the voltage deviation variation of the corresponding battery with a preset diagnosis pattern.

4. The apparatus of claim 3, wherein the preset diagnosis pattern corresponds to at least one of:
a first diagnosis pattern corresponding to the sum of the plurality of voltage deviation variations;
a second diagnosis pattern corresponding to the magnitude of each of the plurality of voltage deviation variations;
a third diagnosis pattern corresponding to a maximum magnitude of the plurality of voltage deviation variations; or
a fourth diagnosis pattern corresponding to the increase pattern of the plurality of voltage deviation variations.

5. The apparatus of claim 4,
wherein the one or more processors are configured to diagnose that an internal micro short circuit has occurred in the battery when the pattern of the plurality of voltage deviation variations corresponds to at least one of the diagnosis patterns.

6. The apparatus of claim 4,
wherein the first diagnosis pattern comprises the one or more processors determining that when the plurality of voltage deviation variations are positive numbers and the sum of the plurality of voltage deviation variations is greater than or equal to a first preset criterion value, an internal micro short circuit has occurred in the battery.

7. The apparatus of claim 4,
wherein the second diagnosis pattern comprises the one or more processors determining that when the plurality of voltage deviation variations are greater than or equal to a second preset criterion value, an internal micro short circuit has occurred in the battery.

8. The apparatus of claim 4,
wherein the third diagnosis pattern comprises the one or more processors determining that when the plurality of voltage deviation variations are positive numbers and at least one of the plurality of voltage deviation variations is greater than or equal to a third preset criterion value, an internal micro short circuit has occurred in the battery.

9. The apparatus of claim 8,
wherein the third preset criterion value is configured to be less than a first preset criterion value that corresponds to the first diagnosis pattern and to be greater than a second preset criterion value that corresponds to the second diagnosis pattern.

10. The apparatus of claim 4,
wherein the fourth diagnosis pattern comprises the one or more processors determining that when the plurality of voltage deviation variations are positive numbers and the plurality of voltage deviation variations increase over time, an internal micro short circuit has occurred in the battery.

11. The apparatus of claim 1,
wherein the one or more processors are configured to calculate an average voltage of the plurality of batteries and calculate a voltage deviation of each battery of the plurality of batteries by calculating a difference between the calculated average voltage and the voltage of each of the plurality of batteries.

12. The apparatus of claim 1, wherein the external device corresponds to one of an onboard vehicle system, an external vehicle system, one or more servers configured to communicate with a vehicle, or a mobile device configured to communicate with the vehicle.

13. A battery pack comprising the apparatus for diagnosing a battery according to claim 1.

14. A vehicle comprising the apparatus for diagnosing a battery according to claim 1.

15. A battery diagnosing method, comprising:
obtaining voltages of a plurality of batteries;
for each battery of the plurality of batteries:
determining, based on the obtained voltages, a voltage deviation at predetermined time periods;
determining, based on the determined voltage deviation, a voltage deviation variation at the predetermined periods;
diagnosing a state of the respective battery by comparing a pattern of the voltage deviation variations of each of the plurality of batteries to a preset diagnosis pattern; and
outputting one or more signals to an external device wherein each signal indicates a battery diagnosis for each battery of the plurality of batteries.

16. The method of claim 15, wherein the preset diagnosis pattern corresponds to at least one of:
a first diagnosis pattern corresponding to a sum of a plurality of voltage deviation variations;
a second diagnosis pattern corresponding to a magnitude of each of the plurality of voltage deviation variations;
a third diagnosis pattern corresponding to a maximum magnitude of the plurality of voltage deviation variations; or
a fourth diagnosis pattern corresponding to an increase pattern of the plurality of voltage deviation variations.

17. The method of claim 16, wherein determining that an internal micro short circuit occurred in the battery based on satisfying the first diagnosis pattern comprises determining that the plurality of voltage deviation variations are positive numbers and the sum of the plurality of voltage deviation variations is greater than or equal to a first preset criterion value.

18. The method of claim 16, wherein determining that an internal micro short circuit occurred in the battery based on satisfying the second diagnosis pattern comprises determining that the plurality of voltage deviation variations are greater than or equal to a second preset criterion value.

19. The method of claim 16, wherein determining that an internal micro short circuit occurred in the battery based on satisfying the third diagnosis pattern comprises determining that the plurality of voltage deviation variations are positive numbers and at least one of the plurality of voltage deviation variations is greater than or equal to a third preset criterion value.

20. The method of claim 16, wherein determining that an internal micro short circuit occurred in the battery based on satisfying the fourth diagnosis pattern comprises determining that the plurality of voltage deviation variations are positive numbers and the plurality of voltage deviation variations increase over time.

\* \* \* \* \*